(12) United States Patent
Kim et al.

(10) Patent No.: US 8,539,138 B2
(45) Date of Patent: Sep. 17, 2013

(54) FLASH MEMORY DEVICE AND METHOD OF PROGRAMMING FLASH MEMORY DEVICE

(75) Inventors: Min Seok Kim, Gwangju (KR); Ki Tae Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 256 days.

(21) Appl. No.: 12/961,791

(22) Filed: Dec. 7, 2010

(65) Prior Publication Data

US 2011/0161571 A1 Jun. 30, 2011

(30) Foreign Application Priority Data

Dec. 28, 2009 (KR) .................. 10-2009-0131729

(51) Int. Cl.
*G06F 12/02* (2006.01)

(52) U.S. Cl.
USPC ...................................... 711/103; 365/185.19

(58) Field of Classification Search
None
See application file for complete search history.

(56) References Cited

U.S. PATENT DOCUMENTS

| | | | |
|---|---|---|---|
| 7,054,199 B2 | 5/2006 | Lee et al. | |
| 7,310,255 B2 | 12/2007 | Chan | |
| 7,894,273 B2 * | 2/2011 | Li et al. | 365/185.28 |
| 7,948,804 B2 * | 5/2011 | Komatsu | 365/185.22 |
| 8,174,895 B2 * | 5/2012 | Chen et al. | 365/185.19 |
| 8,223,556 B2 * | 7/2012 | Dutta et al. | 365/185.22 |

FOREIGN PATENT DOCUMENTS

| | | |
|---|---|---|
| JP | 2005243230 A | 9/2005 |
| JP | 2009522707 A | 6/2009 |
| KR | 1020050087264 A | 8/2005 |
| KR | 100624301 B1 | 9/2006 |
| KR | 1020080096645 A | 10/2008 |
| WO | 2007076512 A2 | 7/2007 |

* cited by examiner

*Primary Examiner* — Gary Portka
(74) *Attorney, Agent, or Firm* — Volentine & Whitt, PLLC

(57) ABSTRACT

A flash memory device performs a program operation using an incremental step pulse programming (ISPP) scheme comprising a plurality of program loops. In each of the program loops, a program pulse operation is performed to increase the threshold voltages of selected memory cells, and a program verify operation is performed to verify a program status of the selected memory cells. The program verify operation can be selectively skipped in some program loops based on a voltage increment of one or more of the program pulse operations, an amount by which threshold voltages of the selected memory cells are to be increased in the ISPP scheme, or a total number of program loops of the ISPP scheme.

11 Claims, 13 Drawing Sheets

FLASH MEMORY DEVICE AND METHOD OF PROGRAMMING FLASH MEMORY DEVICE

CROSS-REFERENCE TO RELATED APPLICATIONS

This application claims priority under 35 U.S.C. §119 to Korean Patent Application No. 10-2009-0131729 filed on Dec. 28, 2009, the disclosure of which is hereby incorporated by reference in its entirety.

BACKGROUND

Embodiments of the inventive concept relate generally to semiconductor memory devices. More particularly, embodiments of the inventive concept relate to flash memory devices and methods of programming the flash memory devices.

Semiconductor memory devices can be roughly divided into two categories based on whether they retain stored data when disconnected from power. These categories include volatile memory devices, which lose stored data when disconnected from power, and nonvolatile memory devices, which retain stored data when disconnected from power. Examples of volatile memory devices include static dynamic random access memory (SRAM) and dynamic random access memory (DRAM). Examples of nonvolatile memory devices include electrically erasable programmable read only memory (EEPROM), ferroelectric random access memory, phase-change random access memory (PRAM), and magnetoresistive random access memory (MRAM).

Flash memory is a type of EEPROM that is widely used in electronic computing systems and many other applications due to its high programming speed, low power consumption, and large storage capacity. Flash memory stores data in an array of memory cells each comprising a charge storage element such as a floating gate or a charge trap layer. In a single level cell (SLC) flash memory, each memory cell stores one bit of data, and in a multi-level cell (MLC) flash memory, at least some memory cells store more than one bit of data. Because MLC flash memories can potentially store much more information than SLC flash memories, researchers continue to seek ways to further develop and improve MLC flash memory technology.

SUMMARY

Embodiments of the inventive concept provide programming methods that can improve the programming performance of MLC flash memory devices while maintaining programming accuracy.

According to an embodiment of the inventive concept, a method of programming a flash memory device comprises programming selected memory cells using an incremental step pulse programming (ISPP) process comprising a plurality of program loops, wherein each of the program loops comprises a program pulse operation that applies a program pulse to the selected memory cells, and at least one of the program loops comprises a program verify operation that verifies a program state of the selected memory cells, and selectively skipping a program verify operation in at least one of the program loops according to (a) a voltage increment of one or more of the program pulse operations, (b) an amount by which threshold voltages of the selected memory cells are to be increased in the ISPP process, or (c) a total number of program loops of the ISPP process.

In certain embodiments, each of the selected memory cells is programmed from a first data state to one of a plurality of second data states, and the program verify operation is skipped with respect to selected memory cells to be programmed to at least one of the second data states located between an upper data state and a lower data state, wherein the upper data state has a threshold voltage distribution greater than the at least one of the second data states, and the lower data state has a threshold voltage distribution lower than the at least one of the second data states.

In certain embodiments, no program verify operation is skipped with respect to selected memory cells to be programmed to the upper data state.

In certain embodiments, no program verify operation is skipped with respect to selected memory cells to be programmed to the lower data state.

In certain embodiments, the program verify operation is skipped with respect to selected memory cells to be programmed to the lower data state where a read margin between the lower data state and an adjacent second data state is greater than a predetermined threshold.

In certain embodiments, the program verify operation is skipped where the voltage increment is greater than or equal to a predetermined reference voltage.

In certain embodiments, the program verify operation is performed where the voltage increment is smaller than the predetermined reference voltage.

In certain embodiments, the program verify operation is selectively skipped in at least one of the program loops.

In certain embodiments, the selected memory cells are 4-bit multi-level cells.

According to another embodiment of the inventive concept, a flash memory device comprises a memory cell array comprising multi-level cells, and a control logic circuit configured to control a program operation of selected memory cells among the multi-level cells, wherein the program operation is performed by an ISPP process comprising a plurality of program loops, wherein each of the program loops comprises a program pulse operation, and one or more of the program loops comprises a program verify operation, wherein the control logic circuit controls the program operation to selectively skip a program verify operation in at least one of the program loops according to (a) a voltage increment of one or more of the program pulse operations, (b) an amount by which threshold voltages of the selected memory cells are to be increased in the ISPP process, or (c) a total number of program loops of the ISPP process.

In certain embodiments, each of the selected memory cells is programmed from a first data state to one of a plurality of second data states, and the control logic circuit controls the program operation to skip the program verify operation with respect to selected memory cells to be programmed to at least one of the second data states located between an upper data state and a lower data state, wherein the upper data state has a threshold voltage distribution greater than the at least one of the second data states, and the lower data state has a threshold voltage distribution lower than the at least one of the second data states.

In certain embodiments, the control logic circuit controls the program operation such that no program verify operation is skipped with respect to selected memory cells to the programmed to the upper data state.

In certain embodiments, the control logic circuit controls the program operation such that no program verify operation is skipped with respect to selected memory cells to the programmed to the lower data state.

In certain embodiments, the control logic circuit controls program operation to skip the program verify operation with respect to selected memory cells to be programmed to the lower data state where a read margin between the lower data state and an adjacent second data state is greater than a predetermined threshold.

In certain embodiments, the control logic circuit controls the program operation to skip the program verify operation where the voltage increment is greater than or equal to a predetermined reference voltage.

In certain embodiments, the control logic circuit controls the program operation to perform the program verify operation where the voltage increment is smaller than the predetermined reference voltage.

In certain embodiments, the program verify operation is selectively skipped in at least one of the program loops.

In certain embodiments, the memory cell array has a NAND flash configuration.

According to another embodiment of the inventive concept, an electronic system comprises a flash memory device, and a memory controller configured to control the flash memory device. The flash memory device comprises a memory cell array comprising multi-level cells, and a control logic circuit configured to control a program operation of selected memory cells among the multi-level cells, wherein the program operation is performed by an ISPP process comprising a plurality of program loops, wherein each of the program loops comprises a program pulse operation, and one or more of the program loops comprises a program verify operation, wherein the control logic circuit controls the program operation to selectively skip a program verify operation in at least one of the program loops according to (a) a voltage increment of one or more of the program pulse operations, (b) an amount by which threshold voltages of the selected memory cells are to be increased in the ISPP process, or (c) a total number of program loops of the ISPP process.

In certain embodiments, the electronic system further comprises a host configured to provide commands to the memory controller to initiate memory access operations of the flash memory device.

BRIEF DESCRIPTION OF THE DRAWINGS

The drawings illustrate selected embodiments of the inventive concept. In the drawings, like reference numbers indicate like features.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

In certain embodiments, an MLC flash memory device selectively skips a program verify operation of program operation based on various factors, such as the arrangement of data states to be programmed, a threshold voltage shift of a selected memory cell, a number of program loops in the program operation, and a voltage increment of a program voltage between program loops. In general, program verify operations can increase the time required to program selected memory cells, but they can also increase the accuracy of the programming operations. Accordingly, certain program verify operations are skipped in order to balance a tradeoff between programming speed and programming accuracy.

Figure 1:
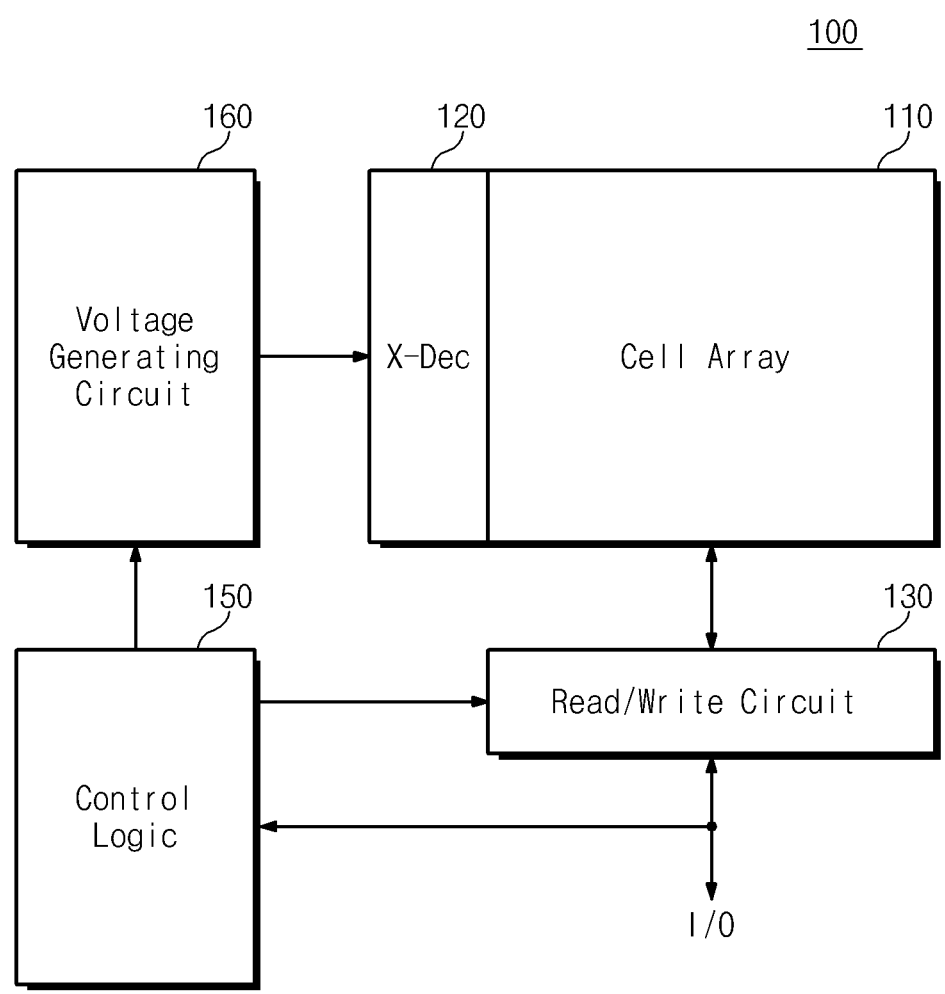
FIG. 1 is a block diagram of a flash memory device according to an embodiment of the inventive concept.
Figure 2:
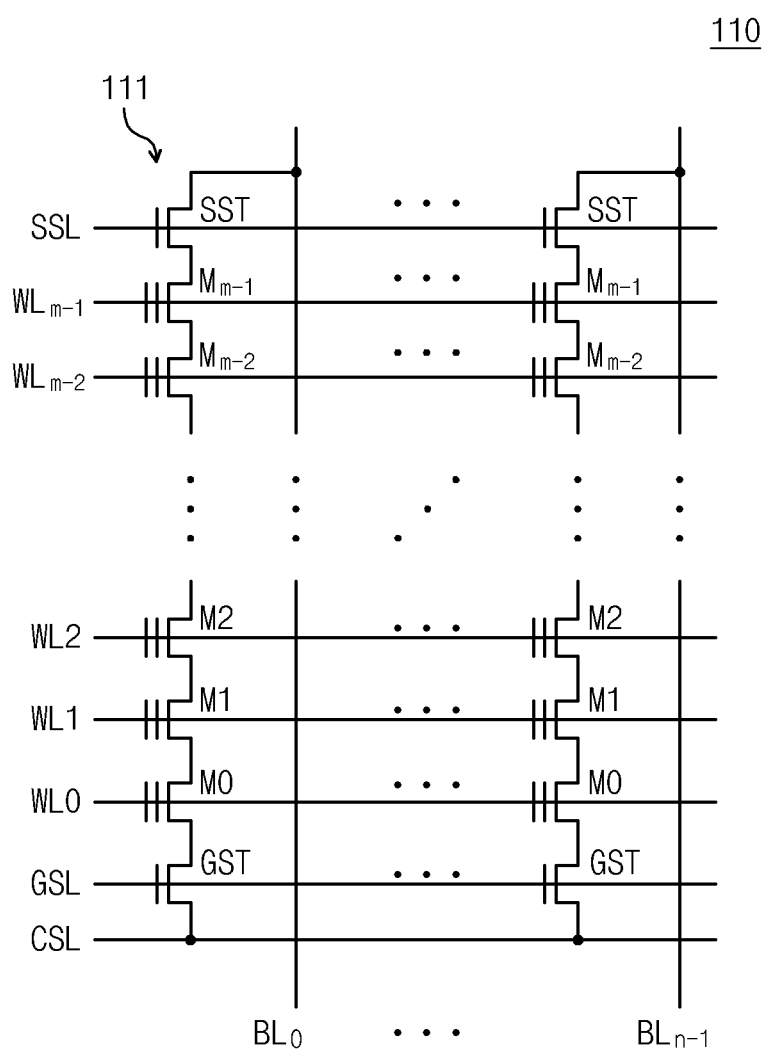
FIGS. 2 and 3 illustrate alternative structures of a memory cell array illustrated in FIG. 1.
Figure 3:
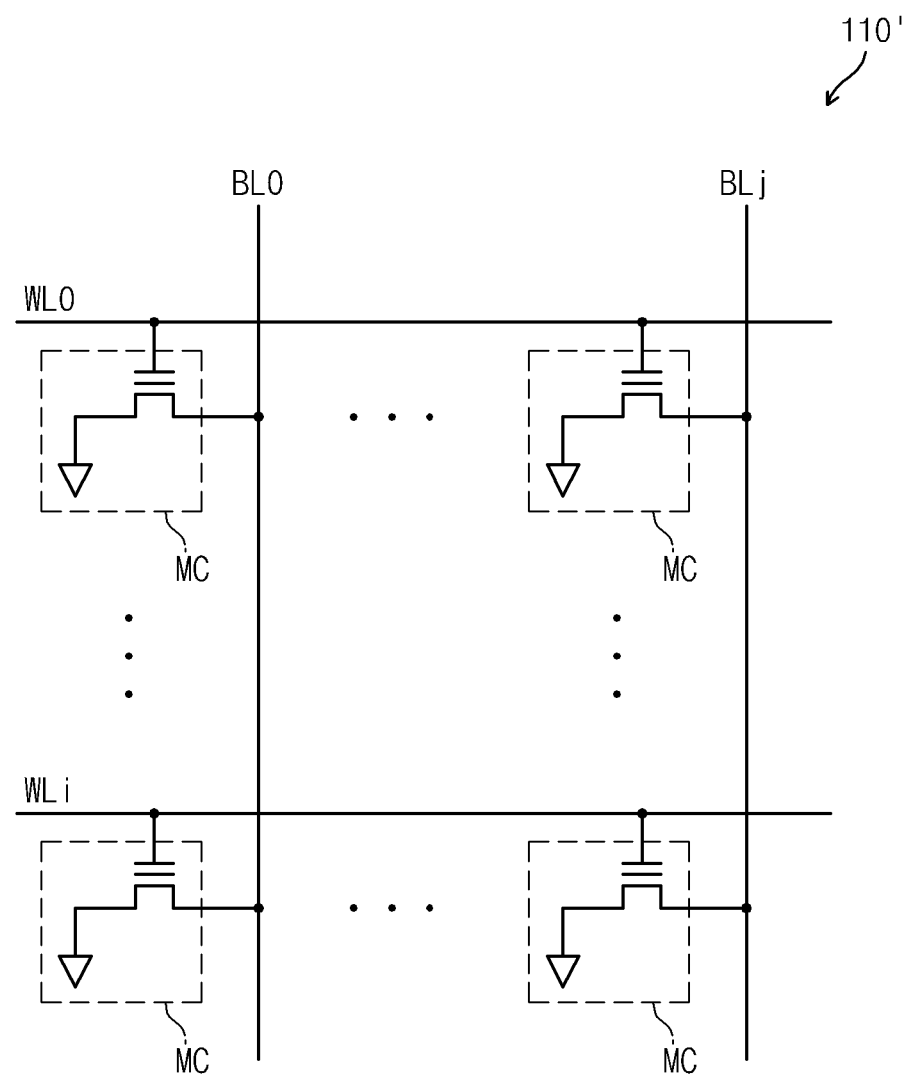

FIG. 1 is a block diagram of a flash memory device 100 according to an embodiment of the inventive concept. FIGS. 2 and 3 are diagrams illustrating alternative structures of a memory cell array 110 illustrated in FIG. 1.

Referring to FIGS. 1 through 3, flash memory device 100 comprises a memory cell array 110, a decoding circuit 120, a read/write circuit 130, control logic circuit 150, and a voltage generating circuit 160.

Memory cell array 110 stores N-bit data in various memory cells, where N is an integer greater than one. Accordingly, flash memory device 100 is an MLC flash memory device. Memory cell array 110 is divided into a main region for storing general data and a spare region for storing additional information related to the general data and the main region. The additional information can comprise, for instance, flag information, error correction codes, device codes, maker codes, and page information. The main region stores N-bit data, and the spare region stores 1-bit data or N-bit data.

The memory cells of memory cell array 110 are arranged in a plurality of rows connected to corresponding wordlines, and a plurality of columns connected to corresponding bitlines. In addition, the memory cells of memory cell array 110 are arranged in a plurality of memory blocks. The memory blocks can have a NAND string structure as illustrated in FIG. 2, or a NOR structure as illustrated in FIG. 3. As will be described below, the operating characteristics of flash memory device 100 can be applied to both the NAND and NOR structures illustrated in FIGS. 2 and 3. In addition, the operating characteristics of flash memory device 100 can be applied not only to a flash memory device having a charge storage layer comprising a conductive floating gate, but also to a charge trap flash (CTF) memory device having a charge storage layer comprising a dielectric layer.

In the NAND structure of FIG. 2, each memory block comprises a plurality of strings 111 corresponding to a plurality of columns or bitlines BL0~BLn-1. Each string comprises a string select transistor SST, a plurality of memory cells M0~Mm-1, and a ground select transistor GST. In the example of FIG. 2 each string comprises one string select transistor SST and one ground select transistor GST. However, this is merely an example of the string structure and the number of string select transistors SST and ground select transistors GST in each string can vary.

In each string 111, the drain of a string select transistor SST is connected to the corresponding bitline and the source of a ground select transistor GST is connected to a common source line CSL. Also, a plurality of memory cells M0~Mm-1 are connected in series between the source of the string select transistor SST and the drain of the ground select transistor GST. The control gates of memory cells in the same row are connected to the same one of wordlines WL0~WLn-1. Each string select transistor SST is controlled by a voltage applied through a string select line SSL, and each ground select transistor GST may be controlled by a voltage applied through a ground select line GSL. Also, memory cells M0~Mm-1 are controlled by voltages applied to corresponding wordlines WL0~WLm-1. The memory cells connected to each wordline WL0~WLm-1 can store one or more pages of data, or a subpage of data that is smaller than a page. The unit of data that is programmed in each program operation can be varied in different embodiments.

In some embodiments, program and read operations of a NAND flash memory are performed on a page basis and programmed data is erased on a block basis, where each block comprises a plurality of pages. In a multi-level cell storing N-bit data, an independent program operation can be performed for each bit.

FIG. 3 shows a memory cell array 110', which is an alternative to memory cell array 110. Memory cell array 110' has a NOR structure in which each memory cell has a first terminal connected directly to ground and a second terminal connected to a bitline. In this structure, the memory cells can be read and programmed individually. In addition, read access times for the memory cells can be faster than the read access times of NAND flash memories.

Referring again to FIG. 1, control logic circuit 150 controls the performance of program/erase/read operations of flash memory device 100. Data to be programmed is loaded into read/write circuit 130 through a buffer (not illustrated) under the control of control logic circuit 150. During a program execution period, control logic circuit 150 controls decoding circuit 120, a voltage generating circuit 160, and read/write circuit 130 to apply a program voltage Vpgm to a selected wordline, to apply a pass voltage Vpass to unselected wordlines, and to apply a voltage of 0V to a bulk of memory cells.

Program voltage Vpgm is generated according to an ISPP scheme. The level of program voltage Vpgm decreases or increases gradually by a predetermined voltage increment $\Delta V$ in successive program loops of the ISPP scheme. The voltage application time, the voltage level, and the number of applications of program voltages Vpgm in each program loop can vary under the control of an external device, such as a memory controller, or an internal device, such as control logic circuit 150.

Voltage generating circuit 160 generates different wordline voltages according to an operation mode of flash memory device 100. These voltages can include, for instance, a program voltage Vpgm, a pass voltage Vpass, a verify voltage Vvfy, and a read voltage Vread. Voltage generating circuit 160 also generates different voltages to be applied the bulk of memory cells, such as a well region, according to different operation modes of flash memory device 100. The voltage generating operation of voltage generating circuit 160 is performed under the control of control logic circuit 150.

Under the control of control logic circuit 150, decoding circuit 120 selects one of the memory blocks (or sectors) of memory cell array 110 and selects one of the wordlines of the selected memory block. Under the control of control logic circuit 150, decoding circuit 120 provides the wordline voltage generated by voltage generating circuit 160 to the selected wordline and the unselected wordlines.

Read/write circuit 130 is controlled by control logic circuit 150, and operates as a sense amplifier or a write driver according to an operation mode of flash memory device 100. For example, in a verify read or normal read operation, read/write circuit 130 operates as a sense amplifier for reading data from memory cell array 110. The data read from read/write circuit 130 in the normal read operation is output through a buffer to an external device, such as a memory controller or a host. The data read in the verify read operation is provided to a pass/fail verify circuit (not illustrated).

In a program operation, read/write circuit 130 operates as a write driver for driving bitlines according to data to be stored in memory cell array 110. In the program operation, read/write circuit 130 receives the data to be stored in memory cell array 110 from the buffer and drives the bitlines according to the received data. Read/write circuit 130 typically comprises a plurality of page buffers (not illustrated) that correspond to respective columns (or bitlines) or column pairs (or bitline pairs).

The program operation comprises a plurality of program loops, where each program loop comprises a program pulse operation in which a program voltage Vpgm is applied to a selected wordline, and a program verify operation in which a verify voltage Vvfy is applied to the selected wordline. In the program verify operation, bitlines connected to selected memory cells are precharged, and a voltage change of precharged bitlines is sensed through the corresponding page buffer. The data sensed in the program verify operation is provided to a pass/fail verify circuit to determine a program pass/fail status of the memory cells.

As will be described below, the flash memory device 100 can selectively skip a program verify operation under the control of control logic circuit 150. In some embodiments, the program verify operation is performed or skipped according to a location of data states to be programmed, a voltage increment of a program voltage to be applied to the selected wordline in each program loop, or a number of program loops of the program operation.

In some embodiments, the program verify operation is skipped in an $i^{th}$ bit program operation of an MLC flash memory device. The $i^{th}$ bit program operation comprises a plurality of program loops (e.g., "n" program loops), and the skipping of a program verify operation can be applied to some of the program loops of the $i^{th}$ bit program operation.

Figure 4:
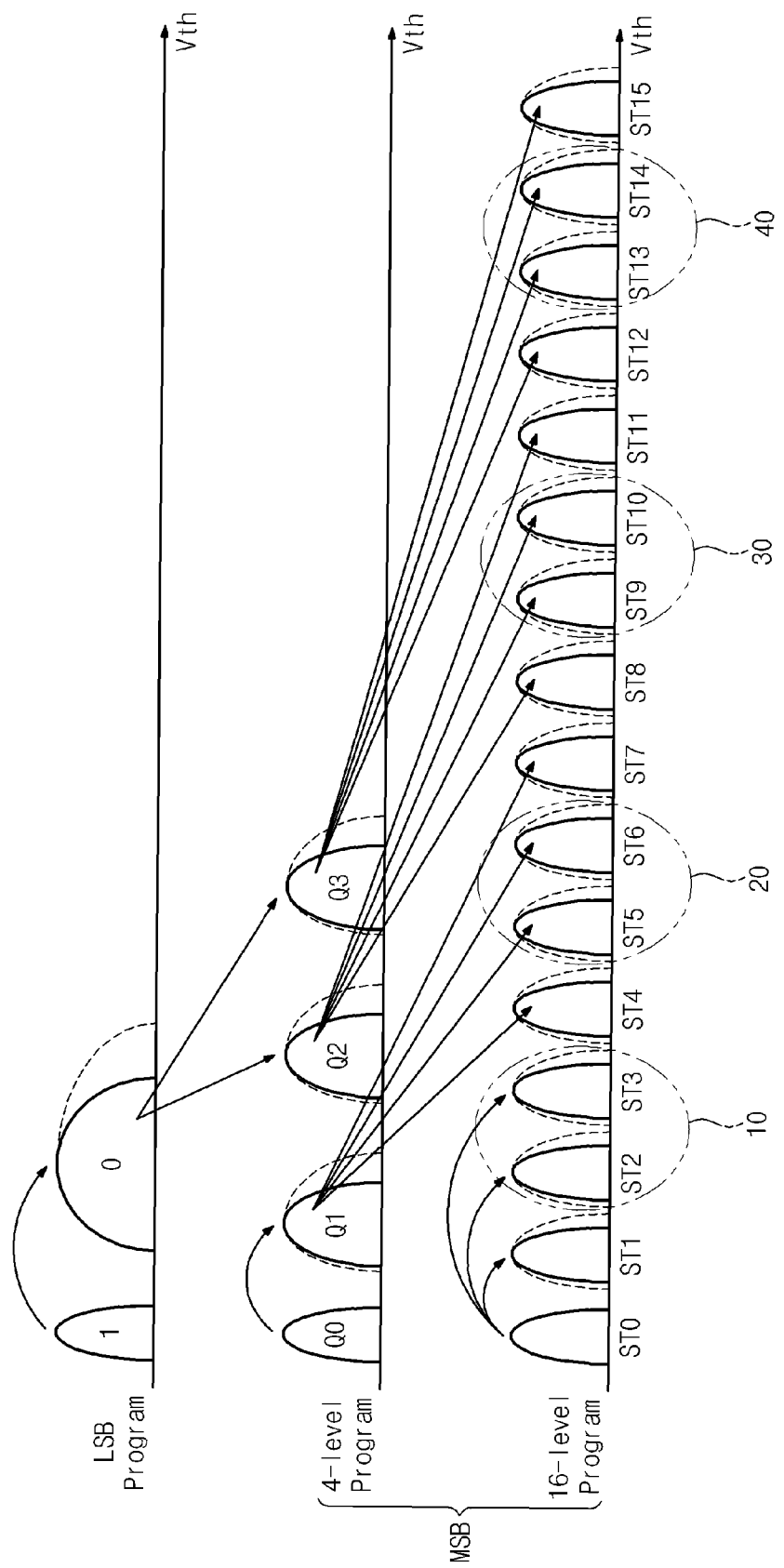
FIG. 4 is a threshold voltage diagram illustrating a method of programming a flash memory device according to an embodiment of the inventive concept.

FIG. 4 is a threshold voltage diagram illustrating a method of programming a flash memory device according to an embodiment of the inventive concept. In the method of FIG. 4, a 4-bit flash memory device is programmed using a 3-step program operation. During the 3-step program operation, a program verify operation is skipped in some program loops.

Referring to FIG. 4, the threshold voltage of a memory cell programmed with 4-bit data may corresponds to one of 16 data states ST0~ST15. Each of the 16 data states has a threshold voltage window. N-bit data (e.g., 4-bit data) can be stored in each memory cell, and each of the bits may be programmed independently through a plurality of program loops.

For example, in a 4-bit MLC, a first bit (e.g., a least significant bit (LSB)) is programmed first among the 4 bits. The threshold voltage distribution of the LSB-programmed memory cell has a 2-level data state ('1' or '0').

Thereafter, three upper bits (e.g., three most significant bits (MSBs)) among the 4 bits other than the LSB are programmed through a plurality of program loops. As an example, in a 3-step program operation, a 2-level data state ('1' or '0') is programmed into 4-level data states Q0~Q3. Thereafter, the 4-level data states Q0~Q3 are programmed into 16-level data states ST0~ST15. Such an operation for programming memory cells into a desired final threshold voltage through a plurality of program steps is called a multi-step program operation. An MLC storing a plurality of bits per cell is programmed through a multi-step program operation comprising a plurality of program steps.

The threshold voltage distributions illustrated in FIG. 4 and the program counts or numbers of program steps for acquiring the threshold voltage distributions are not limited to specific values and may be varied in other embodiments. For example, although not illustrated in FIG. 4, 16-level data states ST0~ST15 can be obtained using intermediate 8-level data states (not illustrated) obtained from 4-level data states Q0~Q3.

In a multi-step program operation, the number of program steps increases with an increase in the number of bits stored per cell. Also, the number of program verify operations increases whenever each program operation is performed. An increase in the number program/program verify operations can lead to an increase in the total program time. Meanwhile, a programmed MLC must maintain a sufficient interval between adjacent threshold voltage states to secure a sufficient read margin. However, in an MLC program operation, the threshold voltage of each data state may deform to a non-ideal shape (See dotted regions in FIG. 4) due to a coupling effect caused by a high voltage applied iteratively to a selected memory cell or to an adjacent memory cell. The shape of each data state can be improved by performing a larger number of program verify operations. Accordingly, as the number of program verify operations increases, programming speed decreases, but accuracy increases.

To address the above tradeoffs between programming speed and accuracy, certain embodiments of the inventive concept are configured to selectively skip a program verify operation in an MLC program operation according to the location of data states to be programmed, the shift amount of a threshold voltage distribution, the voltage increment of a program voltage to be applied in each program loop, or the number of program loops in the program operation.

In a multi-step program operation, the amount of distortion in the shape of a threshold voltage distribution tends to vary according to the amount of shift that it undergoes when being programmed. For example, in FIG. 4, data state Q1 shifts to one of data states ST4, ST5, ST6 and ST7. Among these possible shifts, the shift from data state Q1 to data state ST4 is smallest and the shift from data state Q1 to data state ST7 is largest. Accordingly, the deformation of the threshold voltage distribution of data state ST7 is larger than the deformation of the threshold voltage distribution of data state ST4.

In the example of FIG. 4, a program verify operation is skipped when programming selected memory cells into data states ST5 and ST6 having a relatively small threshold voltage distortion (see, reference number 20), and the program verify operation is not skipped when programming the selected memory cells into data state ST7 having a relatively large threshold voltage distortion. The program verify operation is not skipped when programming selected memory cells into data state ST4 having a smallest amount of threshold voltage distortion because the threshold voltage distribution of data state ST4 is relatively close to the threshold voltage distribution of data state ST3 due to MLC programming characteristics. Thus, in order to achieve programming accuracy, the program verify operation is not skipped with respect to the program operation into data state ST4.

The programming characteristics indicated by reference number 20 can also be applied to other data states, as indicated by reference numbers 10, 30 and 40 of FIG. 4. The program verify operations contribute to accurate control operations such that the relevant threshold voltages fall within a predetermined threshold voltage window. However, if a sufficient read margin is secured between data state ST4 and an adjacent data state (e.g., ST3), a program verify operation may be skipped in the program operation into data state ST4.

In FIG. 4, program verify operations are skipped according to the respective locations of data states. In further embodiments, program verify operations are skipped according to other aspects of a program operation.

FIGS. 5A through 6B are diagrams illustrating a method of programming a flash memory device according to another embodiment of the inventive concept.

Figure 5A:
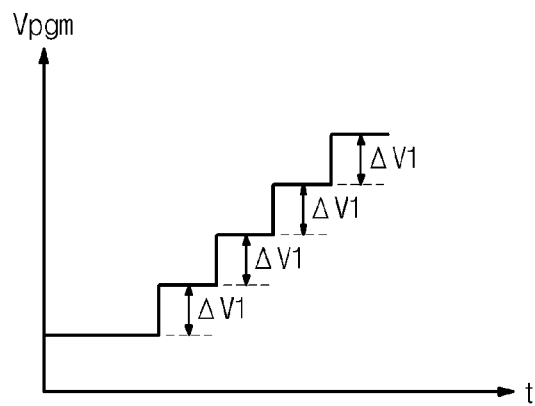
FIGS. 5A through 6B illustrate a method of programming a flash memory device according to another embodiment of the inventive concept.
Figure 6A:
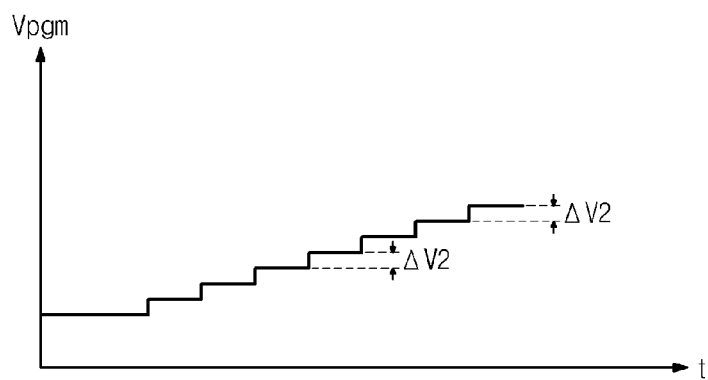

FIGS. 5A and 6A illustrate an example of a program voltage Vpgm to be applied to selected memory cells in successive program loops of a program operation. The incrementing values of program voltage Vpgm are generated according an ISPP scheme. In FIG. 5A, voltage Vpgm is incremented by a first voltage increment $\Delta V1$ in each program loop, and in FIG. 6A, voltage Vpgm is incremented by a second voltage increment $\Delta V2$ in each program loop. Second voltage increment $\Delta V2$ is smaller than the first voltage increment $\Delta V1$.

Figure 5B:
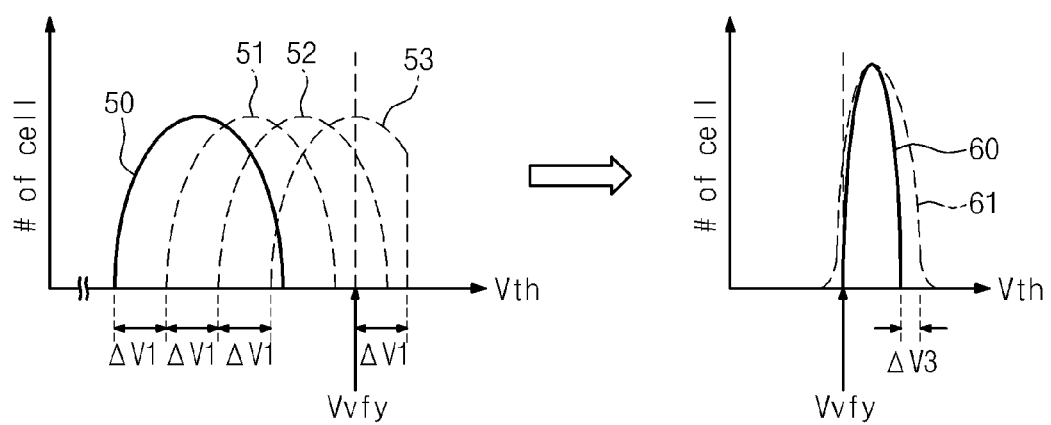

Referring to FIGS. 5A and 5B, memory cells shift from a first threshold voltage distribution 50 to a second threshold voltage distribution 60 by being programmed by a plurality of step pulse voltages with first voltage increment $\Delta V1$. The threshold voltage shift caused by each step pulse voltage can be achieved by Fowler-Nordheim (F-N) tunneling in the case of a NAND flash memory, and by channel hot electron (CHE) injection effect in the case of a NOR flash memory. As the increasing step pulse voltages are applied to selected memory cells, the threshold voltage distribution of the selected memory cells shifts sequentially as indicated by the sequence of reference numbers 50→51→52→53→ . . . →60. Ideally, after the program operation, the selected memory cells achieve the threshold voltage distribution represented by reference number 60. However, due to coupling effects, the threshold voltage distribution can be deformed as indicated by a reference number 61.

Figure 6B:
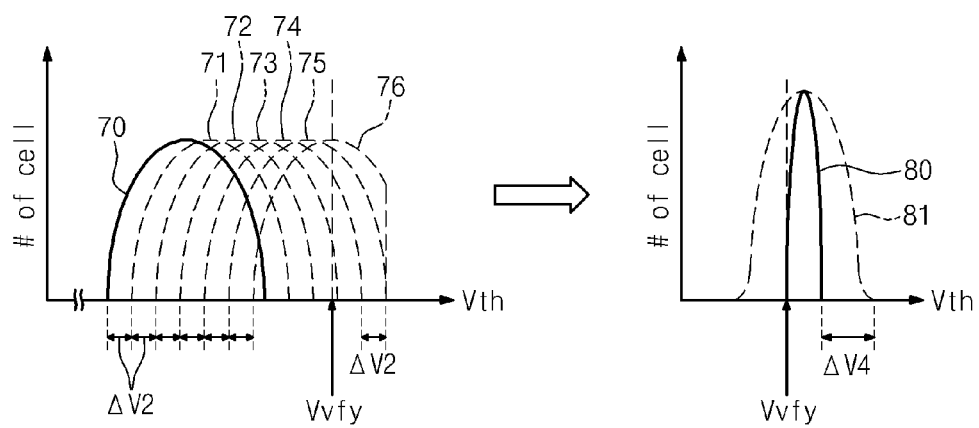

Referring to FIGS. 6A and 6B, selected memory cells shift from a third threshold voltage distribution 70 to a fourth threshold voltage distribution 80 by being programmed by a plurality of step pulse voltages using second voltage increment $\Delta V2$. As the step pulse voltages are applied with increasing magnitude to the selected memory cells, the distribution of memory cells shifts sequentially in the order of 70→71→72→73→ . . . →80. Ideally, the threshold voltage distribution of the selected memory cells after program completion is represented by a reference number 80. However, due to coupling effects, the threshold voltage distribution of the selected memory cells deforms as represented by a reference number 81.

Referring to FIGS. 5B and 6B, second voltage increment $\Delta V2$ is smaller than first voltage increment $\Delta V1$. Accordingly, the voltage shift amount in each program loop using second voltage increment $\Delta V2$ is smaller than the voltage shift amount in each program loop using first voltage increment $\Delta V1$. Consequently, more program loops are required to achieve a predetermined threshold voltage shift using second voltage increment $\Delta V2$ compared with first voltage increment $\Delta V1$. An increase in the number of program loops means an increase in an iterated program count, which can increase a coupling effect in each memory cell. Thus, as illustrated in FIGS. 5B and 6B, the deformation amount of the threshold voltage distribution formed finally after the program completion can be larger when using second voltage increment $\Delta V2$ than when using first voltage increment $\Delta V1$ ($\Delta V4 > \Delta V3$). In other words, for a program operation with a specific voltage shift, the amount of distortion in programmed memory cells can increase with a decrease in the voltage increment of an ISPP.

To avoid the large distortion ΔV4, the method of FIGS. 5A through 6B can skip a program verify operation in a program loop using a voltage increment (e.g., ΔV1) that is greater than or equal to a predetermined reference voltage increment ΔVref, and can avoid skipping a program verify operation in a program loop using a voltage increment (e.g., ΔV2) that is smaller than the predetermined reference voltage increment ΔVref. The program verify operation can be skipped in one or more program loops of a program step. Also, the reference voltage increment ΔVref used as a criterion for skipping a program verify operation is not limited to a specific value but can vary in different embodiments.

Figure 7:
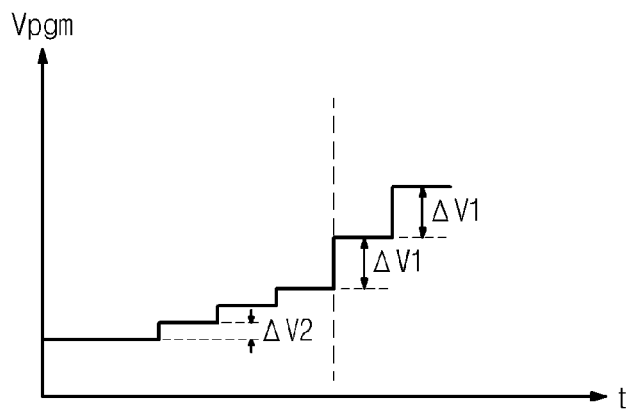
FIGS. 7 through 9 illustrate a method of programming a flash memory device according to still another embodiment of the inventive concept.
Figure 8:
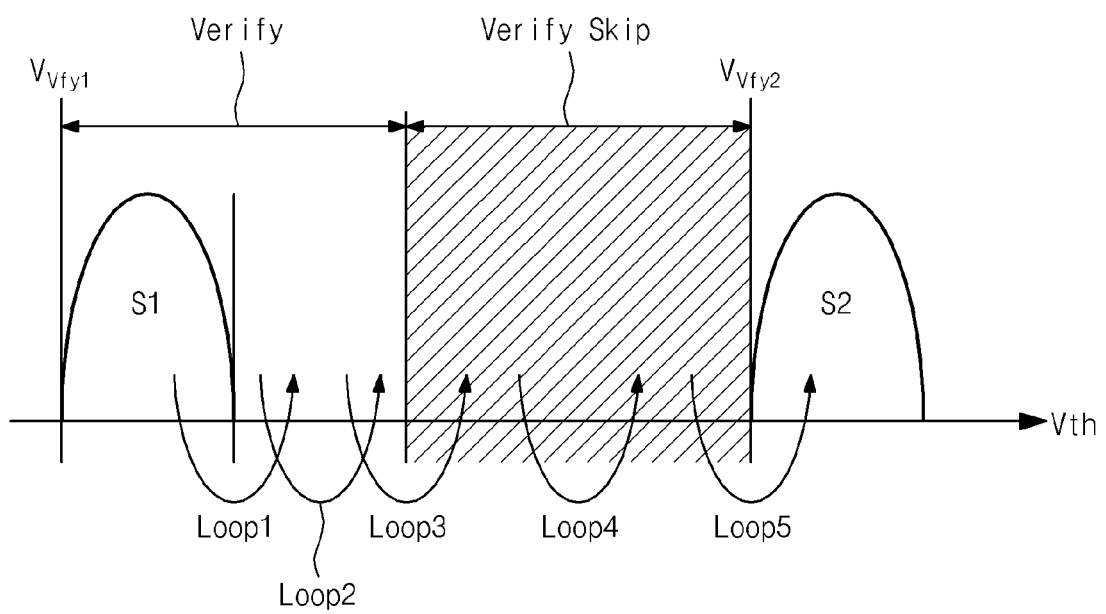
Figure 9:
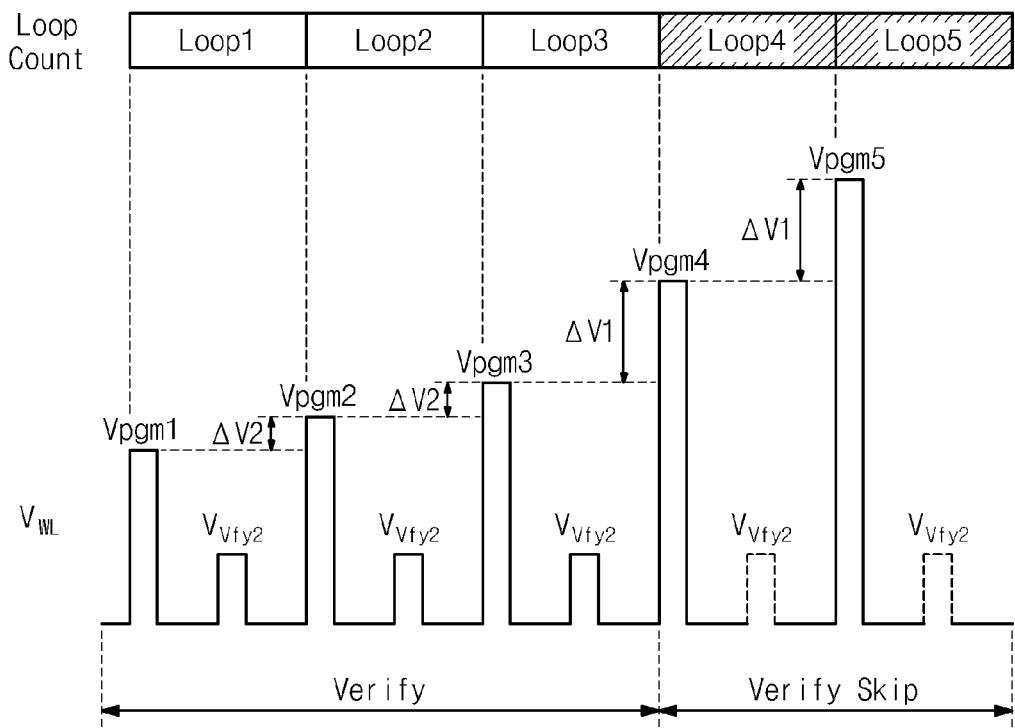

FIGS. 7 through 9 are diagrams illustrating a method of programming a flash memory device in which a program verify operation is skipped in one or more program loops according to an embodiment of the inventive concept.

FIGS. 7 through 9 illustrate a program operation and a program verify operation in which first voltage increment ΔV1 is used in certain program loops after second voltage increment ΔV2 is used in initial program loops.

Referring to FIG. 7, at least two voltage increments ΔV1 and ΔV2 with different levels can be applied to selected memory cells in a plurality of program loops to program the selected memory cells from a first data state 51 into a second data state S2. Although FIG. 7 shows two different voltage increments, the number of different voltage increments can be varied in alternative embodiments.

Referring to FIGS. 7 through 9, as program loops iterate, the threshold voltage of a selected memory cell with a first data state 51 shifts gradually to the threshold voltage of a second data state S2. The threshold voltage shift in each of program loops Loop1, Loop2 and Loop3 using the second voltage increment ΔV2 is smaller than the threshold voltage shift amount in each of program loops Loop4 and Loop5 using the first voltage increment ΔV1.

In FIGS. 7 through 9, second voltage increment ΔV2 is applied in three program loops. However, second voltage increment ΔV2 can be applied in fewer or additional program loops. The amount of distortion in the threshold voltage distribution of selected memory cells can be adjusted by increasing the number of program loops using second voltage increment ΔV2.

In the example of FIGS. 7 through 9, a program verify operation is skipped in program loops that use second voltage increment ΔV2, which is smaller than the first voltage increment ΔV1 (or predetermined reference voltage increment ΔVref). In addition, a program verify operation is skipped in program loops Loop4 and Loop5 that use the first voltage increment ΔV1, which is larger than or equal to second voltage increment ΔV2 (or the predetermined reference voltage increment ΔVref). The reason for skipping program verify operations in loops Loop4 and Loop5 is that first voltage increment ΔV1 tends to cause less distortion in a threshold voltage distribution compared with second voltage increment ΔV2.

As indicated by the foregoing, the method of FIGS. 7 through 9 performs a program verify operation where a relatively small voltage increment is used in an ISPP, and skips a program verify operation where a relatively large voltage increment is used in the ISPP. Consequently, the method improves programming speed while maintaining program accuracy.

Figure 10:
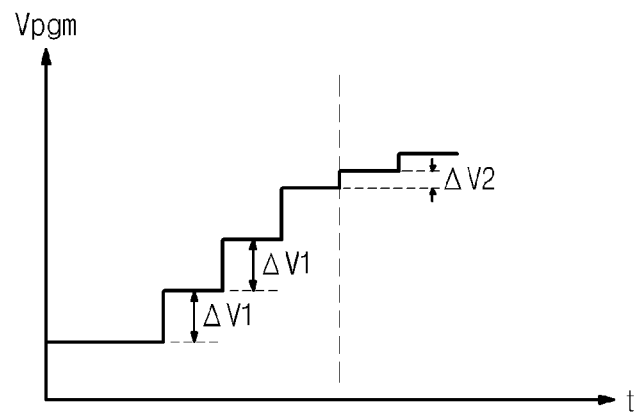
FIGS. 10 through 12 illustrate a method of programming a flash memory device according to still another embodiment of the inventive concept.
Figure 11:
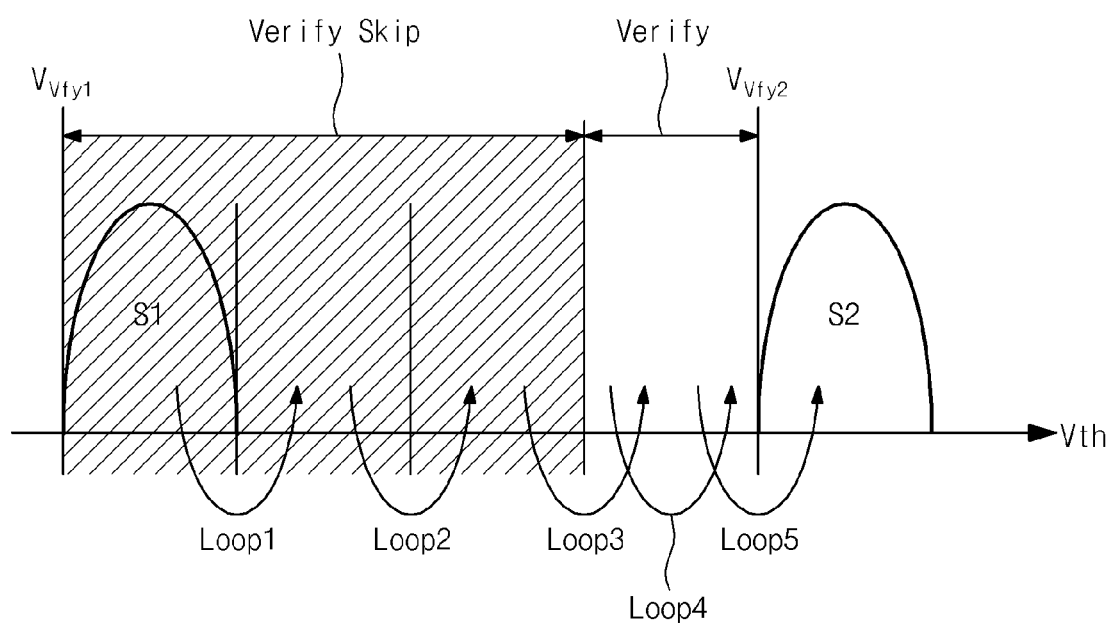
Figure 12:
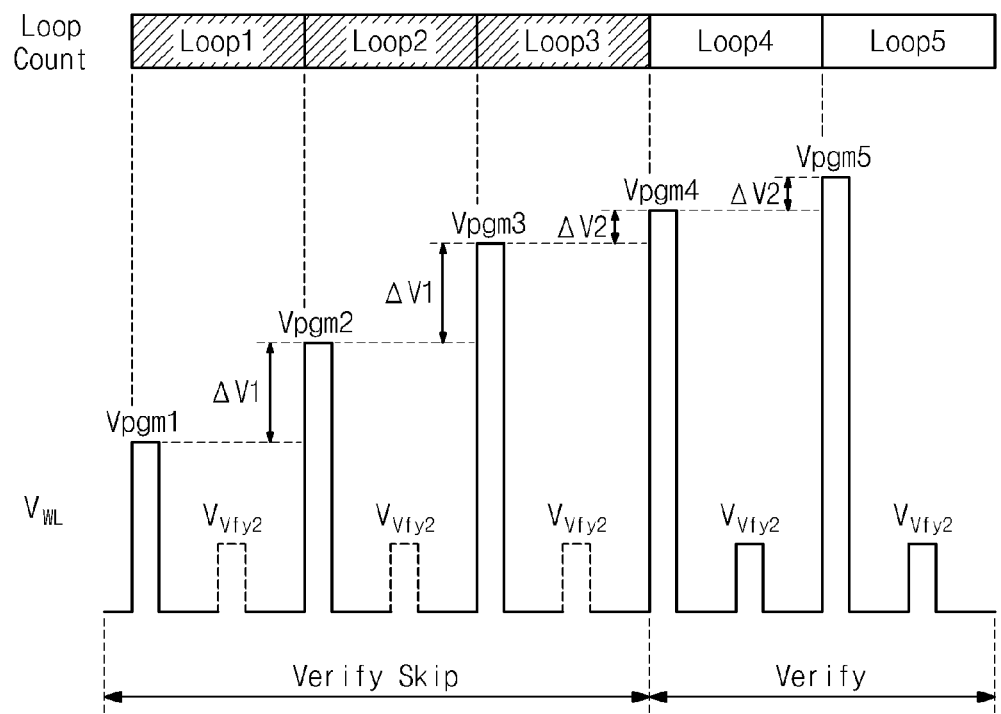

FIGS. 10 through 12 illustrate a method of programming a flash memory device in which a program verify operation is skipped in some program loops according to another embodiment of the inventive concept.

In the method of FIGS. 10 through 12, a program operation applies a first voltage increment ΔV1 in some program loops, and applies a second voltage increment ΔV2 that is smaller than the first voltage increment ΔV1 in other program loops.

The method of FIGS. 10 through 12 differs from the method of FIGS. 7 to 9 in that the order of applying first voltage increment ΔV1 and second voltage increment ΔV2 has been changed. Consequently, in the method of FIGS. 10 through 12, the program operation skips a program verify operation in program loops Loop1, Loop2, and Loop3 that use first voltage increment ΔV1, which is greater than or equal to second voltage increment ΔV2 (or predetermined reference voltage increment ΔVref). The program operation does not skip a program verify operation in program loops Loop4 and Loop5 that use second voltage increment ΔV2, which is smaller than first voltage increment ΔV1 (or predetermined reference voltage increment ΔVref).

In the method of FIGS. 10 through 12, a program verify operation is skipped in a program loop that causes a relatively small threshold voltage distortion in a selected memory cell, and a program verify operation is performed in a program loop that causes a relatively large threshold voltage distortion in a selected memory cell. Consequently, the method can improve programming speed while maintaining programming accuracy.

Figure 13:
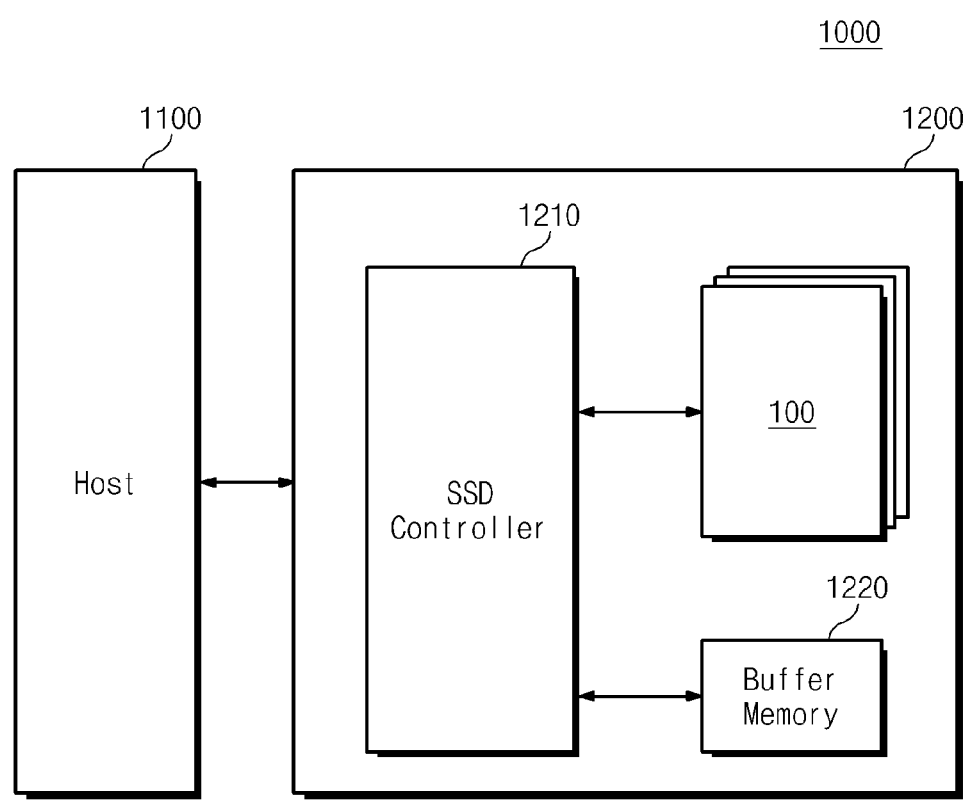
FIG. 13 is a block diagram of a solid state drive (SSD) system comprising a flash memory device according to an embodiment of the inventive concept.

FIG. 13 is a block diagram of an SSD system 1000 comprising a flash memory device 100 according to an embodiment of the inventive concept.

Referring to FIG. 13, SSD system 1000 comprises a host 1100 and an SSD 1200. SSD 1200 comprises an SSD controller 1210, a buffer memory 1220, and a flash memory device 100.

SSD controller 1210 provides an interface between SSD 1200 and host 1100 according to a bus format of host 1100. SSD controller 1210 decodes a command received from host 1100, and accesses flash memory device 100 according to a result of the decoding. Examples of the bus format of host 1100 include universal serial bus (USB), small computer system interface (SCSI), PCI express, advanced technology attachment (ATA), parallel ATA (PATA), serial ATA (SATA), and serial attached SCSI (SAS).

Buffer memory 1220 comprises a synchronous DRAM. However, this is merely an example of the structure of buffer memory 1220 and buffer memory 1220 can be implemented with other types of memories.

Buffer memory 1220 temporarily stores write data received from host 1100 or data read from flash memory device 100. In response to a read request of host 1100, data in flash memory device 100 is stored in buffer memory 1220. Buffer memory 1220 also supports a cache function for providing stored data directly to host 1100. The data transfer rate of the bus of host 1100 is typically much higher than the data transfer rate of a memory channel of SSD 1200. Accordingly, to reduce performance degradation due to the rate difference, buffer memory 1220 can be designed to have a relatively high capacity.

Flash memory device 100 is used as a main memory of SSD 1200 and comprises a NAND flash memory having a high storage capacity. However, flash memory device 100 is not limited to a NAND flash memory. For example, flash memory device 100 could comprise a hybrid flash memory with at least two types of mixed memory cells, or a One-NAND flash memory with an internal controller embedded in a memory chip. Also, a plurality of channels can be provided in SSD 1200 and a plurality of flash memory devices 100 can be connected to each of the channels. As additional alternatives to using a NAND flash memory as a main memory of SSD 1200, other types of nonvolatile memories can be used, such as FRAM, MRAM, ReRAM, and FRAM, or other types of volatile memory can be used, such as DRAM and SRAM.

Flash memory device 100 of FIG. 13 has substantially the same configuration as flash memory device 100 of FIG. 1. Also, flash memory device 100 of FIG. 13 can perform or skip a program verify operation in an MLC program operation selectively according to locations of data states to be programmed, the shift amount of a threshold voltage distribution, the voltage increment of a program voltage to be applied in each program loop, or the number of program loops for a program operation.

Figure 14:
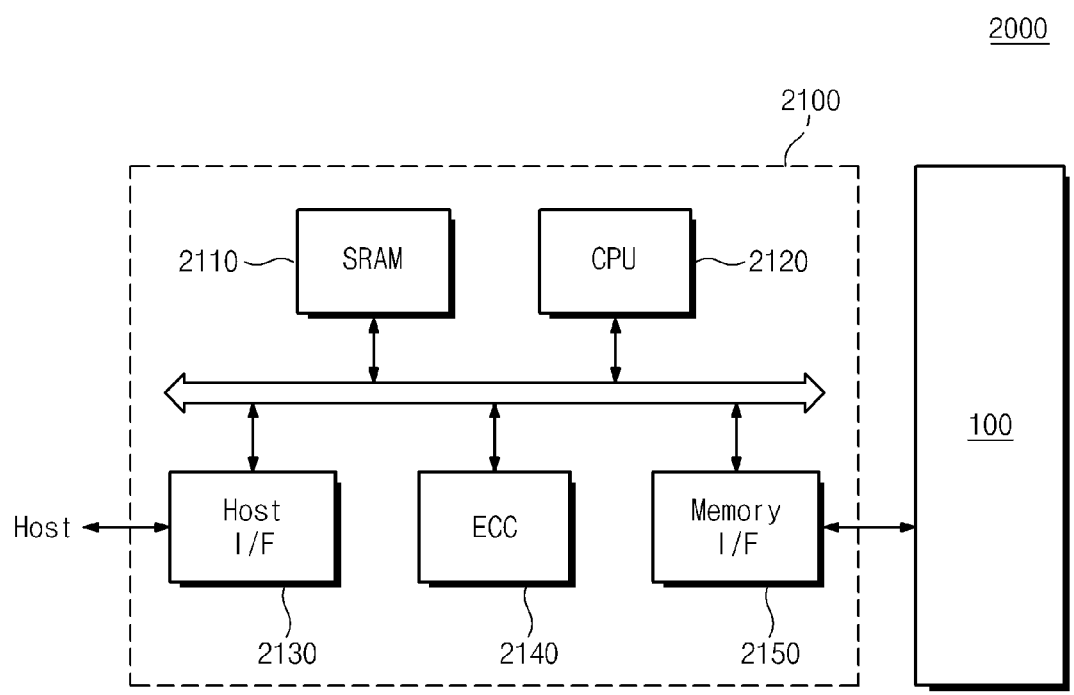
FIG. 14 is a block diagram of a memory system according to an embodiment of the inventive concept.

FIG. 14 is a block diagram of a memory system 2000 according to an embodiment of the inventive concept.

Referring to FIG. 14, memory system 2000 comprises a flash memory device 100 and a memory controller 2100.

Flash memory device 100 of FIG. 14 has substantially the same configuration as flash memory device 100 of FIG. 1. Also, flash memory device 100 of FIG. 14 selectively performs or skips a program verify operation in an MLC program operation according to the location of data states to be programmed, the shift amount of a threshold voltage distribution, the voltage increment of a program voltage to be applied in each program loop, or the number of program loops for the program operation.

Memory controller 2100 is configured to control flash memory device 100. Collectively, flash memory device 100 and memory controller 2100 can function as a memory card or an SSD. An SRAM 2110 is used as a working memory of a central processing unit (CPU) 2120. A host interface (I/F) 2130 implements a data exchange protocol of a host connected to memory system 2000. An error correction code (ECC) unit 2140 detects and correct an error in the data read from flash memory device 100. A memory interface (I/F) 2150 interfaces with flash memory device 100. CPU 2120 controls operations for data exchange of memory controller 2100. Although not illustrated in FIG. 14, memory system 2000 further comprises a read-only memory (ROM) that stores code data for interfacing with the host.

In various alternative embodiments, flash memory device 100 can be provided as a multi-chip package comprising a plurality of flash memory chips. Memory system 2000 can be provided as a high-reliability storage medium with a low error probability. Flash memory device 100 can be provided in a memory system such as an SSD. Memory controller 2100 can be configured to communicate with an external device, such as a host, through one of various interface protocols such as USB, MMC, PCI, PCI-E, SAS, SATA, PATA, SCSI and IDE. Also, memory controller 2100 can have a configuration for performing a random operation.

Figure 15:
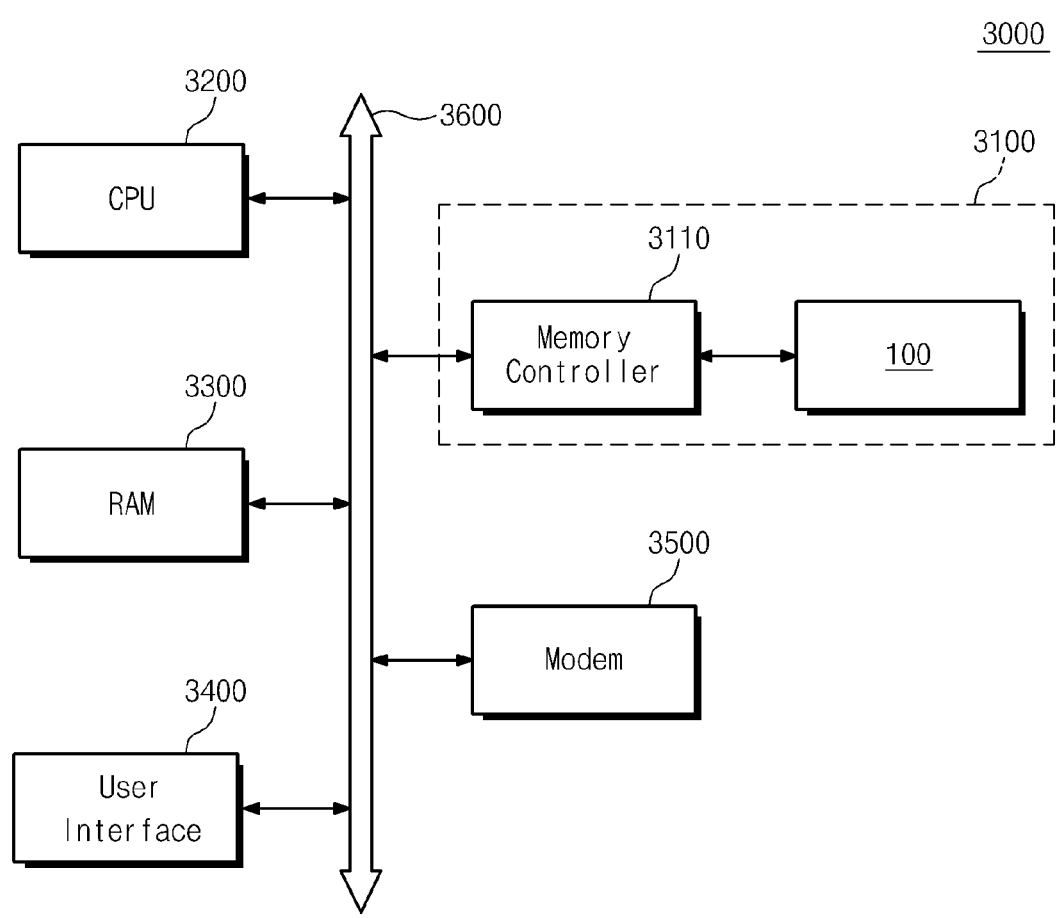
FIG. 15 is a block diagram of a computing system comprising a flash memory device according to an embodiment of the inventive concept.

FIG. 15 is a block diagram of a computing system 3000 comprising a flash memory device 100 according to an embodiment of the inventive concept.

Referring to FIG. 15, computing system 3000 comprises a CPU 3200, a RAM 3300, a user interface 3400, a modem (e.g., baseband chipset) 3500 and a memory system 3100 that are electrically connected to a system bus 3600.

Memory system 3100 comprises a memory controller 3110 and a flash memory device 100. Memory controller 3110 provides a physical connection with flash memory device 100 through system bus 3600. In other words, memory controller 3110 can provide an interface with flash memory device 100 according to the bus format of CPU 3200.

Flash memory device 100 of FIG. 15 has substantially the same configuration as flash memory device 100 of FIG. 1. Also, flash memory device 100 of FIG. 15 selectively performs or skips a program verify operation in an MLC program operation according to the location of data states to be programmed, the shift amount of a threshold voltage distribution, the voltage increment of a program voltage to be applied in each program loop, or the number of program loops for the program operation.

Where computing system 3000 is a mobile device, a battery (not illustrated) can be further provided to supply an operating voltage. Although not illustrated in FIG. 15, computing system 3000 can further comprise an application chipset, a camera image processor, and a mobile DRAM. Memory system 3100 can comprise an SSD that uses a nonvolatile memory to store data. For example, memory system 3100 of FIG. 15 can comprise SSD 1200 of FIG. 13. In this case, memory controller 3110 can operate as an SSD controller.

The nonvolatile memory devices and/or memory controllers described above can be mounted in various types of packages. Examples of types of packages for the flash memory device and/or the memory controller include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), and wafer-level processed stack package (WSP).

As indicated by the foregoing, certain embodiments of the inventive concept omit a program verify operation from one or more program loops based on factors such as the location or arrangement of threshold voltage distributions of target data states, the magnitudes of different voltage increments used in the program loops, and so on.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of programming a flash memory device, comprising:
   programming selected memory cells using an incremental step pulse programming (ISPP) process comprising a plurality of program loops based on at least two voltage increments having respectively different levels, wherein each of the program loops comprises a program pulse operation that applies a program pulse to the selected memory cells, and at least one of the program loops comprises a program verify operation that verifies a program state of the selected memory cells; and
   selectively skipping the program verify operation in at least one of the program loops according to a voltage increment of one or more of the program pulse operations.

2. The method of claim 1, wherein the program verify operation is skipped where the voltage increment is greater than or equal to a predetermined reference voltage.

3. The method of claim 2, wherein the program verify operation is performed where the voltage increment is smaller than the predetermined reference voltage.

4. The method of claim 1, wherein the selected memory cells are 4-bit multi-level cells.

5. A flash memory device, comprising:
a memory cell array comprising multi-level cells; and
a control logic circuit configured to control a program operation of selected memory cells among the multi-level cells, wherein the program operation is performed by an incremental step pulse programming (ISPP) process comprising a plurality of program loops based on at least two voltage increments having respectively different levels, wherein each of the program loops comprises a program pulse operation, and one or more of the program loops comprises a program verify operation,
wherein the control logic circuit controls the program operation to selectively skip a program verify operation in at least one of the program loops according to a voltage increment of one or more of the program pulse operations.

6. The flash memory device of claim 5, wherein the control logic circuit controls the program operation to skip the program verify operation where the voltage increment is greater than or equal to a predetermined reference voltage.

7. The flash memory device of claim 6, wherein the control logic circuit controls the program operation to perform the program verify operation where the voltage increment is smaller than the predetermined reference voltage.

8. The flash memory device of claim 5, wherein the program verify operation is selectively skipped in at least one of the program loops.

9. The flash memory device of claim 5, wherein the memory cell array has a NAND flash configuration.

10. An electronic system comprising:
a flash memory device; and
a memory controller configured to control the flash memory device, the flash memory device comprising:
a memory cell array comprising multi-level cells; and
a control logic circuit configured to control a program operation of selected memory cells among the multi-level cells, wherein the program operation is performed by an incremental step pulse programming (ISPP) process comprising a plurality of program loops based on at least two voltage increments having respectively different levels, wherein each of the program loops comprises a program pulse operation, and one or more of the program loops comprises a program verify operation,
wherein the control logic circuit controls the program operation to selectively skip a program verify operation in at least one of the program loops according to a voltage increment of one or more of the program pulse operations.

11. The electronic system of claim 10, further comprising a host configured to provide commands to the memory controller to initiate memory access operations of the flash memory device.

* * * * *